July 16, 1968 R. M. WARNER, JR 3,393,376

PUNCH-THROUGH MICROWAVE OSCILLATOR

Filed April 15. 1966 2 Sheets-Sheet 1

RAYMOND M. WARNER, JR.
INVENTOR

E. Mickey Hubbard
ATTORNEY

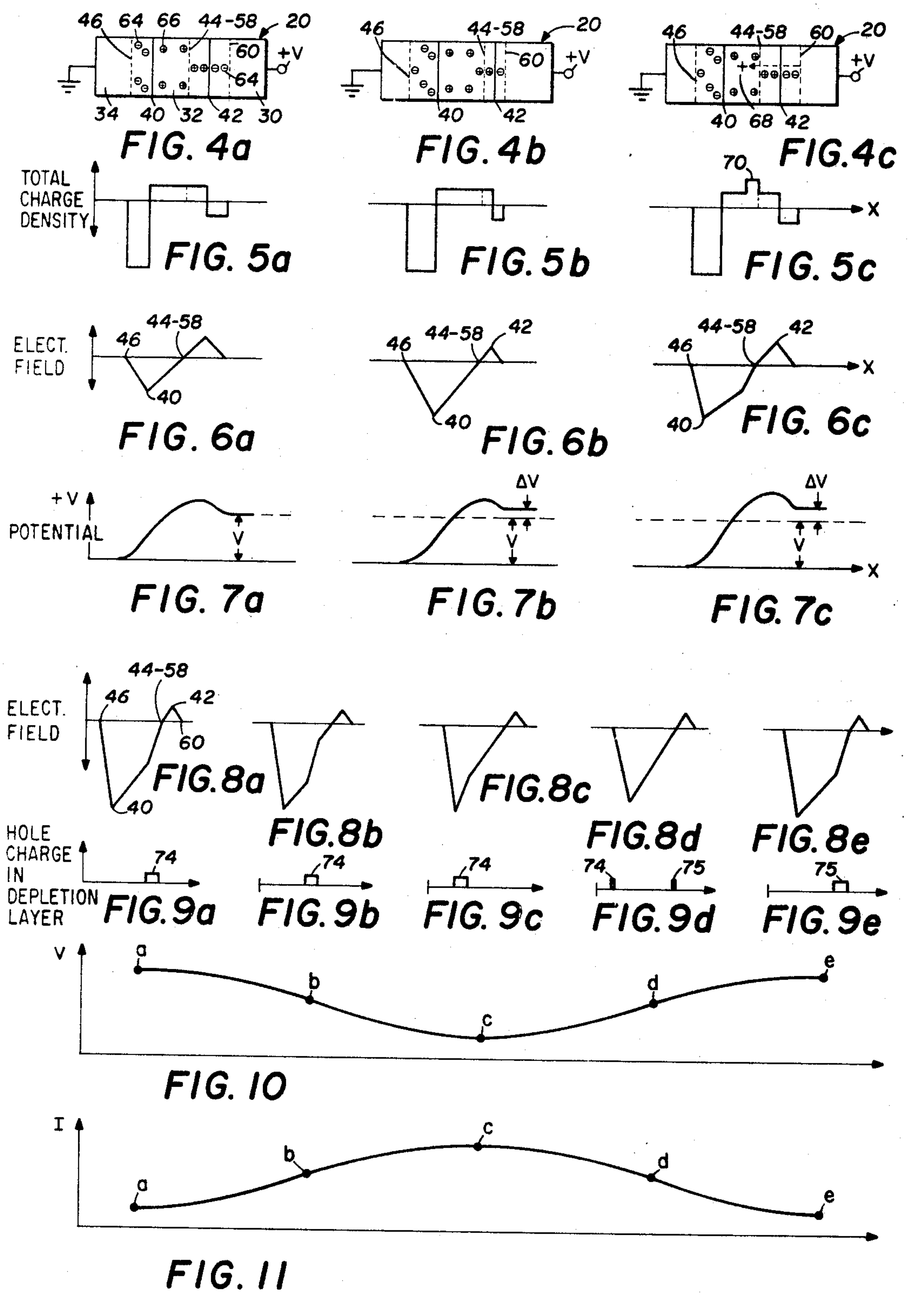
FIG. 4a, FIG. 4b, FIG. 4c, FIG. 5a, FIG. 5b, FIG. 5c, FIG. 6a, FIG. 6b, FIG. 6c, FIG. 7a, FIG. 7b, FIG. 7c, FIG. 8a, FIG. 8b, FIG. 8c, FIG. 8d, FIG. 8e, FIG. 9a, FIG. 9b, FIG. 9c, FIG. 9d, FIG. 9e, FIG. 10, FIG. 11

United States Patent Office 3,393,376
Patented July 16, 1968

3,393,376

PUNCH-THROUGH MICROWAVE OSCILLATOR

Raymond M. Warner, Jr., Dallas, Tex., assignor to Texas Instruments Incorporated, Dallas, Tex., a corporation of Delaware Filed Apr. 15, 1966, Ser. No. 542,891
6 Claims. (Cl. 331—107)

ABSTRACT OF THE DISCLOSURE

Disclosed is a semiconductor oscillator having a forward-biased junction and a reverse-biased junction. By controlling the doping levels of the different regions of the oscillator and by controlling the width of the region between the two junctions, the depletion layer of the reverse-biased junction will extend to the depletion layer of the forward-biased junction at a voltage substantially less than the avalanche voltage of the oscillator. When the oscillator is biased to a voltage sufficient to cause the depletion layers of the two junctions to meet, carriers pass through the forward-biased junction and drift through the depletion layer to the reverse-biased junction in bunches, thereby causing periodic variations in the voltage across and the current through the oscillator.

This invention relates generally to microwave oscillators, and more particularly relates to an improved semiconductor oscillator for use in a microwave cavity or the like.

It is known that a single-junction diode situated in a suitable microwave cavity can be made to oscillate at microwave frequencies by reverse biasing the diode into the avalanche region. Basically the oscillation is a consequence of the interplay of the avalanche generation of carriers and their transit time through the depletion layer. As the carriers generated by the avalanche mechanism proceed through the depletion layer, the carriers alter the field distribution so as to change the avalanching conditions and decrease the number of carriers being generated in the depletion layer. Then after some carriers have passed through the depletion layer and have been collected, the field reverts to its original condition so that the number of carriers generated in the depletion layer by the avalanche mechanism is again increased until the field distribution changes and the cycle is repeated. Detailed numerical calculations have been performed which show the fluctuations of field and carrier distributions in such an oscillator, but these calculations lack the conceptual simplicity required for the ready generation of a design theory. In the single junction diode, the sequence of events leading to oscillation is complicated because avalanching occurs within a volume which is an appreciable fraction of the total depletion layer volume, and because carriers of both polarities are involved.

Another type of semiconductor oscillator is known as the Read diode. The Read diode has conceptual and design simplicity, but experience has proven such a diode difficult to make. In the Read diode, the field peaks near one boundary of the depletion layer and avalanching is confined to a very thin region near that boundary. Consequently, carriers of one polarity are collected almost immediately, while carriers of the opposite polarity travel almost the full thickness of the depletion layer. Since the major portion of the depletion layer region is composed of a virtually intrinsic material, the carriers move at their constant high-field or saturated velocity, and hence the transit time is simply the thickness of the depletion layer divided by the high-field velocity. The difficulties in fabricating such a diode oscillator stem largely from the fact that the intrinsic layer is required; this layer must either be very pure, or else must be very precisely compensated, in order to realize an essentially constant field through the relatively thick depletion layer required for usable frequencies. Another significant disadvantage of the Read diode is that comparatively large biasing potentials, typically several hundred volts, are required to provide the desired field distribution.

An important object of this invention is to provide a semiconductor oscillator having conceptual simplicity which may be easily and economically designed and fabricated.

Another very important object of the invention is to provide a semiconductor oscillator suitable for generating microwave frequencies that can be operated at relatively low biasing potentials.

The oscillator fabricated in accordance with this invention is a three layer device, either PNP or NPN, which utilizes the mechanism known as punch-through (which has heretofore plagued the fabricators of transistors), and the transit of carriers through a depletion layer at drift velocity. The center layer of the device has a thickness and a doping level selected so that the depletion layer of the reverse-biased junction will extend to the depletion layer of the forward-biased junction resulting in punch-through, i.e., the lowering of the field barrier formed by the forward-biased junction to a level which will result in the injection of a group of carriers into the depletion layer of the reverse-biased junction at a biasing voltage well below that required for significant amounts of avalanching in the particular junction. The region from which the carriers pass is very lightly doped to discourage emission of carriers prior to punch-through. Also, the areas of the depletion layers of both junctions should preferably be reduced to a small value so as to minimize the capacitance of the device to obtain an appropriately high impedance at the frequency of oscillation.

The novel features believed characteristic of this invention are set forth in the appended claims. The invention itself, however, as well as other objects and advantages thereof, may best be understood by reference to the following detailed description of an illustrative embodiment, when read in conjunction with the accompanying drawings, wherein:

Figure 12:
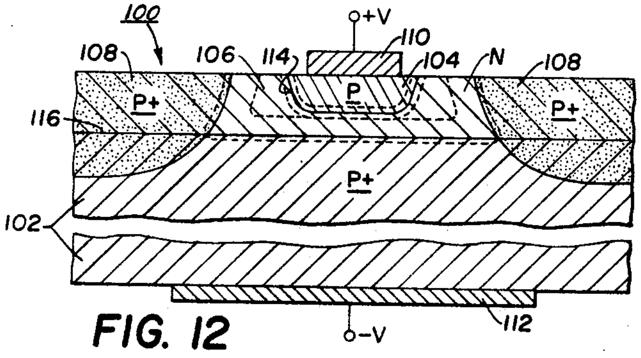

FIGURES *4a–4c* are schematic drawings representing the charge distribution across an oscillator device constructed in accordance with the present invention which attempt to illustrate the machanism causing oscillation;

FIGURES *5a–5c* are graphs representing the charge distribution across the devices of FIGURES *4a–4c*, respectively;

FIGURES *6a–6c* are graphs representing the electric field distribution across the devices of FIGURES *4a–4c*, respectively;

FIGURES *7a–7c* are graphs representing the potential distribution across the devices of FIGURES *4a–4c*, respectively;

FIGURES *8a–8e* are graphs similar to those of FIGURES *6a–6c* illustrating the electric field during one cycle of oscillation of the device of FIGURES *4a–4c*;

FIGURES *9a–9e* are graphs representing carrier transport through the depletion layer of the oscillator device of FIGURES *4a–4c*;

FIGURE 10 is a plot of the voltage across the oscillator device at the points in time represented in FIGURES 8a–8e, respectively;

FIGURE 11 is a plot of current through the oscillator device at the points in time represented in FIGURES 8a–8e, respectively; and FIGURE 12 is a schematic sectional view illustrating another oscillator constructed in accordance with the present invention.

Figures 1, 2, 3:
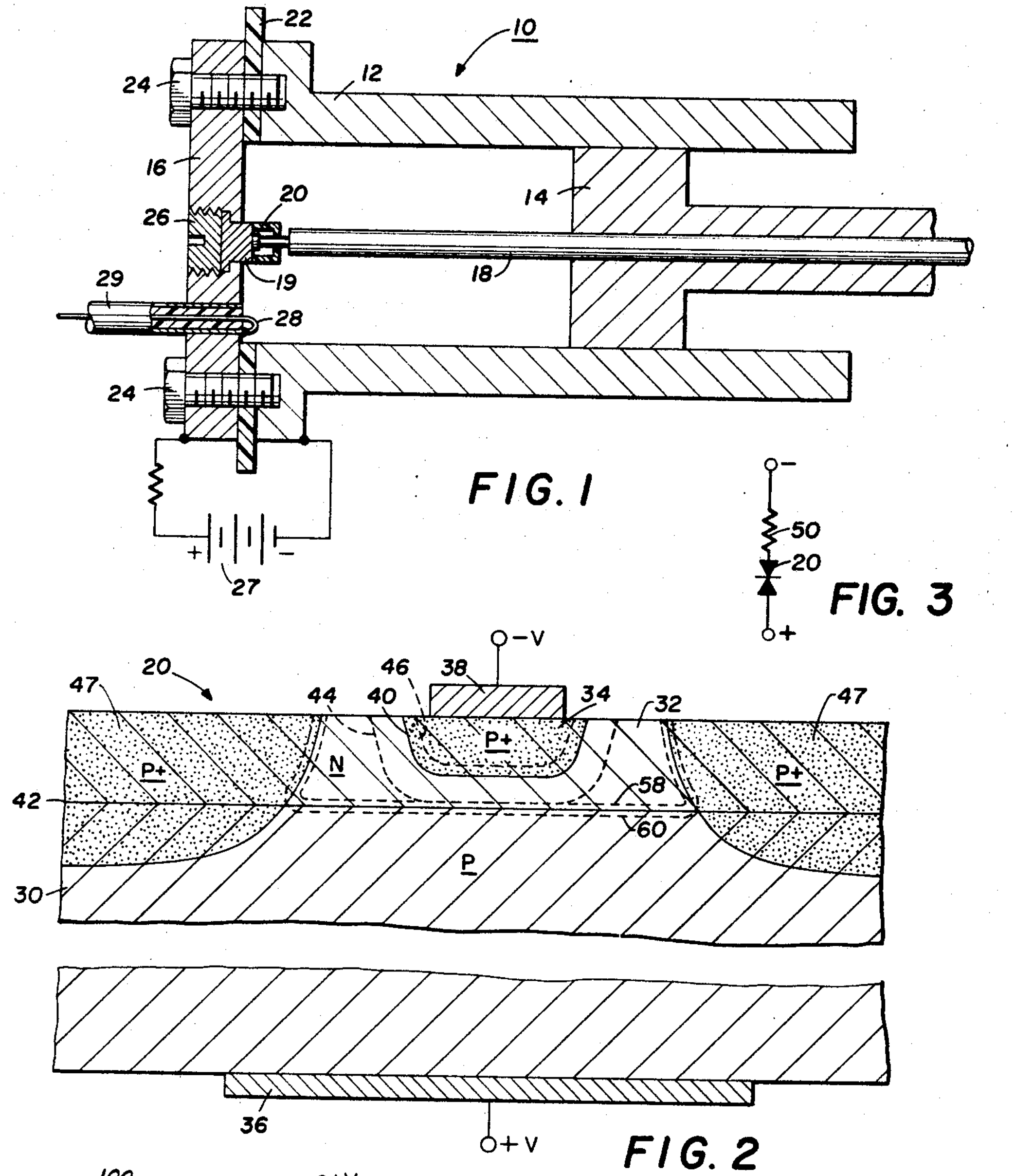
FIGURE 1 is a somewhat schematic sectional view representing a conventional microwave cavity with which the oscillator of the present invention may be used.
FIGURE 2 is a schematic sectional view illustrating an oscillator constructed in accordance with the present invention.
FIGURE 3 is a schematic circuit diagram representing the oscillator and microwave circuit.

Referring now to the drawings, a conventional microwave cavity is illustrated schematically in FIGURE 1 and is designated generally by the reference numeral 10. The microwave cavity 10 comprises a cylindrical shell 12 closed at one end by a movable piston 14 and at the other end by a plate 16. The piston 14 is movable to permit tuning the cavity and is in good electrical contact with the cylindrical shell 12. A fixed rod 18 extends through the tuning piston 14 and makes electrical contact with a semiconductor oscillator 20 fabricated in accordance with the present invention as will hereafter be described. Good electrical contact is also provided between the fixed rod 18 and the piston 14. The plate 16 is electrically insulated from the shell 12 by an insulating gasket 22, and the plate 16 is connected to the cylinder 12 by electrically nonconductive bolts 24. The semiconductor device 20 is received in a suitable holder 19 which may he held in the cavity by plug 26. The semiconductor device 20 is biased by a suitable D.C. voltage source 27 through a conductive path extending from the positive terminal through a resistor intended to limit the direct current through the plate 16, plug 26, holder 19, the oscillator device 20, rod 18, piston 14 and cylindrical housing 12 back to the negative terminal of the voltage source. An output coupling loop 28 is positioned in the cavity and the microwave output signal is carried from the cavity by transmission line 29. The microwave cavity 10 is of conventional design and is merely an example of a typical microwave cavity in which the oscillator of the present invention can be operated.

The semiconductor oscillator device 20 is illustrated schematically in the sectional view of FIGURE 2. The oscillator is a three layer device and may be either PNP or NPN. For simplicity, only a PNP device will be described in detail, although it is to be understood that an NPN device would function essentially in the same manner, except that the carriers would be electrons rather than holes and the device would be biased in the opposite direction. The device 20 comprises a light doped P-type region 30, an N-type region 32 and a P-type region 34. Electrodes 36 and 38 are in good ohmic contact with the P-type regions 30 and 34, respectively. In the operation of the device, the electrode 36 is positive and the electrode 38 is negative so that the junction 42 between regions 30 and 32 is forward biased and the junction 40 between regions 32 and 34 is reverse biased. As a result of reverse biasing junction 40, a relatively thick depletion layer is formed at the junction which may be represented by the dotted lines 44 and 46. As a result of forward biasing junction 42, a relatively thin depletion layer is formed at the junction, the boundaries of which are represented by the dotted lines 58 and 60. Of course, it must be understood that the boundaries of the depletion layers are not smooth or distinct and that the dotted lines are merely representative of the boundaries for illustrative purposes.

In accordance with this invention, it is important that the geometry of the device 20 and the doping levels of the regions be such that the edge 44 of the depletion layer of the reverse-biased junction 40 extend to and touch the edge 58 of the depletion layer of the forward-biased junction 42 at a bias voltage level across the electrodes substantially less than that required to produce avalanching, typically one-tenth the avalanche voltage. In general, the higher the doping level of region 34 and the lower the doping level of region 32, the thicker the depletion layer for a given voltage. The thickness of the N-type region 32 between the P-type regions 30 and 34 is selected to produce the desired frequency of operation as hereafter described, and by properly selecting the doping levels of the regions 32 and 34. In the present invention, it is important that the P-type region 30 be a poor emitter for purposes which will presently be described, and for this reason region 30 is very lightly doped material. It is also desirable for both junctions 40 and 42 to be small in area so as to reduce the capacitance of the device. For this reason, a relatively heavily doped P-type region 47 is formed around the P-type region 34 and extends to the P-type region 30 so as to form a junction of restricted area.

The device 20 may be fabricated using any suitable conventional technique. For example, the N-type layer 32 may be epitaxially formed on the P-type layer 30, and then the P-type regions 34 and 47 diffused into the layer 32. Typically, the P-type region 30 may have a resistance of three ohm-centimeters, the N-type region 32 a resistance of one ohm-centimeter, and the P-type diffused region 34 a surface concentration of about $10^{19}$ boron atoms per cc. The annular region 47 may have about the same or a higher doping level than region 34.

Alternative configuration for the oscillator device of this invention is indicated generally by the reference numeral 100 in FIGURE 12. The device 100 is substantially the same as the device 20, except that the two P-type regions are reversed and the polarity of the biasing potential is also reversed. The fundamental operation of the two devices remains essentially the same. Thus in the device 100, the substrate 102 is the more heavily doped P-type region, corresponding to the diffused region 34 in the device 20, while the smaller region 104 is the more lightly doped P-type region, corresponding to the substrate 30 in the device 20. In the device 100, the N-type region may be formed as an epitaxial layer on the substrate 102, and the P-type region 104 then formed by selectively etching a pit and epitaxially refilling the pit by techniques known in the art. Then an annular, heavily doped P-type region 108 may be diffused through the N-type epitaxial layer 106 to limit the area of the junction between the N-type region 106 and the heavily doped P-type region 101. Electrodes 110 and 112 are provided to make good ohmic contact with the P-type regions 104 and 102, respectively. The device 100 is biased by making electrode 110 positive with respect to electrode 112 so that the junction 114 between regions 104 and 106 is forward-biased and the junction 116 between the N-type region 106 and the P-type region 102 is reverse-biased. It is important to note that the N-type region in either the device 20 or the device 100 may be fabricated by a selective etch and epitaxial refill if desired, rather than by the formation of an epitaxial layer and the subsequent diffusion of the P-type isolation ring. It is to be understood that any suitable techniques for fabricating the device may be used without departing from the scope of the invention.

The devices 20 and 100 are thus special purpose three layer diodes of the general class sometimes represented by the symbol 20 in FIGURE 3. At microwave oscillation, frequencies, the cavity in which the device has been placed will present an appreciable impedance to the terminals of the device. This impedance is represented schematically in FIGURE 3 by the resistive impedance 50 in series with the device.

Operation of the device 20, as well as the device 100, is illustrated by the highly idealized schematic drawings of FIGURES 4a–4c wherein corresponding parts of the device 20 are represented by corresponding reference characters. FIGURE 4a represents the condition when the device 20 is biased so that the two depletion edges 44 and 58 just meet. The donor ions are indicated by the reference numeral 64 and the acceptor ions by the reference numeral 66. In this condition, some current will flow through the device as a result of the emission of carriers from region 30, but this current is relatively low. Under this condition, the total charge density across the device is represented by the idealized graph of FIGURE 5*a*, the electric field is represented by the idealized graph of FIGURE 6*a*, and the potential distribution is represented by the idealized graph of FIGURE 7*a*, all taken with respect to the geometrical distance normal to the junctions of the device 20.

In FIGURE 4*b*, the biasing potential across the device has been increased by some finite value $\Delta V$ illustrated in FIGURE 7*b*. As a result, the depletion layer of the forward-biased junction 42 is increased which decreases the depletion layer of the junction 40 so that the edge 44–58 moves toward the forward-biased junction. The number of donor ions in the depletion layer of the reverse-biased junction 40 is increased and the number in the depletion layer of the forward-biased junction 42 is decreased, as illustrated in FIGURE 4*b*. The decrease in the thickness of the depletion layer of the forward-biased junction 42 lowers the barrier against the emission of holes from the P-type region 30, and a group of holes, represented by the hole 68 in FIGURE 4*c*, diffuse across the depletion layer of the junction 42 and are injected into the depletion layer of the reverse-biased junction 40. As will be noted in FIGURE 5*c*, the charge density is increased by a pulse 70 at a point adjacent to the depletion layer boundary 44–58. The additional group of hole carriers 68 re-establishes the distribution of charges and thereby re-establishes the electric field barrier at junction 42 to essentially the same value represented in FIGURE 6*a* so that the number of hole carriers passing the junction is again reduced. The hole carriers are then in the electric field of the reverse-biased depletion layer and travel essentially at the maximum drift velocity.

FIGURES 8*a*–8*e*, 9*a*–9*e*, 10 and 11 attempt to illustrate why the device oscillates by considering the field distributions accompanying the transit of the group of holes 68 through the depletion layer of the forward-biased junction 42. FIGURES 8*a*–8*e* are similar to FIGURES 6*a*–6*c* and represent the electric field with respect to length through the device normal to the junction at times *a*–*e*. FIGURES 9*a*–9*e* show the position of the hole charge in the depletion layer resulting from the group of holes 68 at corresponding times *a*–*e*. FIGURE 10 shows the voltage across the device at times *a*–*e*, and FIGURE 11 shows the current through the device at times *a*–*e*.

Referring to FIGURE 8*a*, it will be noted that the field distribution between the edge 46 of the depletion layer and the junction 40 is convex and that the hole charge 74 is in a low field region so that the velocity of the hole charge is relatively low. This results in a low current as illustrated in FIGURE 11, and also results in a high voltage as illustrated at point *a* in FIGURE 10. As the cluster of holes represented by the charge 74 drifts toward the junction 40 as illustrated in FIGURE 9*b*, the field intensity increases materially so that the current increases and the voltage decreases. By the time the carriers reach the junction 40, they are in a region of maximum field and are traveling at substantially their limiting and constant saturation velocity. As soon as the carriers begin to pass the junction 40, the current, of course, decreases and the voltage once again increases. As the voltage increases, the barrier formed by the depletion layer of the forward-biased junction 42 is reduced to a sufficient level for a new group of holes 75 to diffuse from the region 30 and be injected into the depletion layer of the reverse-biased junction 40 at time *e* to repeat the cycle.

The drawings depict a somewhat idealized analysis of the oscillation mechanism. It will be appreciated by those skilled in the art that the boundaries of the charge distribution involved are diffused and that there are, therefore, no very abrupt changes. Accordingly, in actual practice the device will normally be biased to such a level that the punch-through mechanism will continually be in operation. As the number of carriers entering the depletion layer increases, the field distribution is altered so as to decrease the likelihood that additional carriers will enter the deplation layer. Then as the carriers pass on through the depletion layer, the field distribution changes in favor of increasing the number of carriers entering the depletion layer. Then as the concentration of carriers pass through the high-field strength region, the current increases and the voltage decreases.

It will be noted that the period of the cycle is equal to approximately twice the transit time of the carriers through the depletion layer from the boundary 44 to the junction 40. Thus, it will be noted that the frequency is related to the thickness of the N-type region 32. However, the frequency of oscillation is not a function only of the thickness of the layer 32 because as the thickness of layer 32 increases, the biasing voltage must also be increased in order to extend the depletion layer of the reverse-biased junction to that of the forward-biased junction and achieve punch-through. However, because carrier velocity tends to saturate in high fields, increasing the thickness of the N-type layer 32, the frequency of oscillation of the device can be decreased. The P-type region 30 is very lightly doped so as to be a poor emitter. If it were a good emitter, carriers would be injected into the central layer at voltages appreciably below the punch-through voltage. These carriers would then have to traverse the undepleted portion of the central layer by diffusion, which is a comparatively slow mode of transport. But in the device described here, the carriers pass through the thick depletion layer of the reverse-biased junction by the drift mechanism. Transfer of the carriers by the diffusion phenomenon through thick undepleted layers should be avoided because the velocity is far too slow for a microwave oscillator.

From the foregoing detailed description of a preferred embodiment of the invention, it will be appreciated by those skilled in the art that a microwave oscillator has been described which can be designed and fabricated with relative ease and which can be operated at a relatively low biasing potential, on the order of one-tenth that required for similar devices which utilize the avalanching mechanism. Although a preferred embodiment of the invention has been described in detail, it is to be understood that various changes, substitutions and alterations can be made therein without departing from the spirit and scope of the invention as defined by the appended claims.

What is claimed is:

1. A semiconductor oscillator for use in a microwave cavity or the like comprising a three layer device of alternate conductivity types forming first and second junctions, one of which is forward biased and the other of which is reverse-biased when a voltage is applied across the device, the layers forming the reverse-biased junction being doped to such levels with relation to the spacing between the junctions that the depletion layer of the reverse-biased junction will extend to the depletion layer of the forward-biased junction at a voltage on the order of one-tenth of the avalanche voltage of the device whereby when the device is biased to a voltage sufficient to cause the depletion layers of the two junctions to meet, carriers will pass through the forward-biased junction and drift through the depletion layer to the reverse-biased junction in bunches thereby causing periodic variations in the voltage across the device and the current through the device, the period being primarily a function of the voltage and the thickness of the depletion layer of the reverse-biased junction.

2. The semiconductor oscillator defined in claim 1 wherein the layer forming the emitter of the forward-biased junction is relatively lightly doped and is therefore a relatively poor emitter of carriers.

3. The semiconductor oscillator defined in claim 1 further characterized by an impedance connected in series with the device in a biasing circuit.

4. A microwave oscillator comprising the combination of a microwave cavity, and a semiconductor oscillator operatively mounted in the cavity comprising a three layer device of alternate conductivity types forming first and second junctions, one of which is forward-biased and the other of which is reverse-biased when a voltage is applied across the device, the layers forming the reverse-biased junction being doped to such levels with relation to the spacing between the junctions that the depletion layer of the reverse-biased junction will extend to the depletion layer of the forward-biased junction at a voltage on the order of one-tenth of the avalanche voltage of the device whereby when the device is biased to a voltage sufficient to cause the depletion layers of the two junctions to meet, carriers will pass through the forward-biased junction and drift through the depletion layer to the reverse-biased junction in bunches thereby causing periodic variations in the voltage across the device and the current through the device, the period being primarily a function of the voltage and the thickness of the depletion layer of the reverse-biased junction.

5. A semiconductor oscillator for use in a microwave cavity or the like comprising first and second regions of one conductivity type separated by a third region of the other type to form first and second junctions with the first and second regions, respectively, the spacing between the junctions and the doping levels of the second and third regions being such that the depletion layer of the second junction when reverse-biased will extend to the depletion layer of the first junction at a voltage on the order of one-tenth of the avalanche voltage of the device, and the first region being lightly doped so as to be a poor emitter when the first junction is forward-biased whereby the voltage across the first and second regions and the current therebetween will vary at a frequency related to the thickness of the third region and the voltage as a result of the injection of bunches of carriers into the depletion layer of the second junction and the transit of the bunches of carriers through the depletion layer.

6. A semiconductor oscillator for use in a microwave cavity or the like comprising a relatively lightly doped, high resistivity first region of one conductivity type, a second region of the opposite conductivity type forming a first junction with the first region, a third region of said one conductivity type more heavily doped than the first region forming a second junction with the second region, the doping levels of the second and third regions and the distance between the first and second junctions being such that a voltage is applied between the first and third regions to forward bias the first junction and reverse bias the second junction, the depletion layers will meet at a voltage on the order of one-tenth of the avalanche voltage of the oscillator and bunches of carriers will periodically be injected into the depletion layer of the reverse-biased junction by the punch-through mechanism to cause periodic variations in the voltage across the oscillator and current through the oscillator, the period of the variations being related to the voltage and the thickness of the depletion layer of the reverse-biased junction.

References Cited

UNITED STATES PATENTS 2,899,646 8/1959 Read ------------ 331—107 X

OTHER REFERENCES

Statz et al.: "The Spacistor, A New Class of High-Frequency Semiconductor Devices," Proceedings of the IRE, Mar. 1957, pp. 317–324.

ROY LAKE, *Primary Examiner.*

S. H. GRIMM, *Assistant Examiner.*